US006288662B1

(12) United States Patent
Yoshizawa

(10) Patent No.: US 6,288,662 B1
(45) Date of Patent: Sep. 11, 2001

(54) A/D CONVERTER CIRCUIT HAVING LADDER RESISTOR NETWORK WITH ALTERNATING FIRST AND SECOND RESISTORS OF DIFFERENT RESISTANCE VALUES

(75) Inventor: Hirokazu Yoshizawa, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/342,425

(22) Filed: Jun. 29, 1999

(30) Foreign Application Priority Data

Jul. 1, 1998 (JP) .................................... 10-186488

(51) Int. Cl.[7] ...................................................... H03M 1/12
(52) U.S. Cl. ........................ 341/155; 341/156; 341/160; 341/161
(58) Field of Search ...................................... 341/154, 156, 341/161, 162

(56) References Cited

U.S. PATENT DOCUMENTS

| 5,016,014 | * | 5/1991 | Bitting ................................. | 341/165 |
| 5,450,085 | * | 9/1995 | Stewart et al. ...................... | 341/159 |
| 5,572,212 | * | 11/1996 | Levinson et al. .................... | 341/162 |
| 5,661,481 | * | 8/1997 | Muramatsu .......................... | 341/120 |
| 5,696,511 | * | 12/1997 | Matsumoto et al. ................. | 341/161 |
| 5,874,912 | * | 2/1999 | Hasegawa ............................ | 341/161 |

* cited by examiner

*Primary Examiner*—Michael Tokar
*Assistant Examiner*—Vibol Tan
(74) *Attorney, Agent, or Firm*—Adams & Wilks

(57) ABSTRACT

In a resistor ladder circuit for supplying reference voltages to sub-A/D converter circuits constituting a pipeline type A/D converter, the circuit is configured in such a way that main resistors are connected in series with auxiliary resistors in order to produce a plurality of reference voltages so that the reference voltages which are supplied to an MDAC in the first stage differ from those which are supplied to the MDACs in and after the second stage.

10 Claims, 9 Drawing Sheets

US 6,288,662 B1

A/D CONVERTER CIRCUIT HAVING LADDER RESISTOR NETWORK WITH ALTERNATING FIRST AND SECOND RESISTORS OF DIFFERENT RESISTANCE VALUES

BACKGROUND OF THE INVENTION

The present invention relates to a pipeline type A/D converter circuit in which each sub-A/D converter and each sub-D/A converter of low bits are arranged as one block and a plurality of these blocks are cascade-connected, and to a configuration of a resistor ladder circuit for use in such a circuit.

Heretofore, there has been proposed the pipeline type A/D converter circuit technology in which each sub-A/D converter and each sub-D/A converter of low bits are arranged as one block and a plurality of these blocks are cascade-connected. The pipeline type A/D converter circuit is, for example, described in an article 1 of Lewis, S. H., and Gray, P. R., "A Pipelined 5-Msample/s 9-bit Analog-to-Digital Converter," Proceeding of IEEE International Symposium on Circuits and Systems, pp. 954 to 961, 1987.

An example of a circuit configuration of a conventional pipelinetype A/D converter circuit is shown in FIG. 5. In addition, an example of a configuration of a sub-A/D converter circuit which is used in each of blocks is shown in FIG. 6. Also, an example of a conventional configuration of a resistor ladder for reference voltages of the sub-A/D converter circuit is shown in FIG. 7. In this example, there is employed the sub-A/D converter circuit of 2 bits (four divisions). In addition, FIG. 8 is a timing chart showing changes in signals with time in the conventional pipeline type A/D converter circuit.

In FIG. 5, a signal vin (FIG. 8(a)) which has been inputted through an A/D converter circuit input terminal 17 is inputted, after having passed through a sample and hold circuit 1, to both of a sub-A/D converter circuit 2 in the first stage and a multiplying D/A converter circuit (hereinafter, referred to as "an MDAC" for short, when applicable) 14 in the first stage. The signal which has been inputted to the sub-A/D converter circuit 2 is, as shown in FIG. 6, sent through a sub-A/D converter circuit input terminal 33 to one of non-inverting input terminals of comparators 21, 22 and 23. On the other hand, reference voltages 60, 61 and 62 which are produced in a resistor ladder circuit shown in FIG. 7 are respectively inputted through sub-A/D converter circuit reference voltage input terminals 34, 35 and 36 to inverting input terminals of the comparators 21, 22 and 23. In FIG. 7, reference voltages 31 and 32 are divided through resistors 27, 28, 29 and 30 to produce the reference voltages 60, 61 and 62. In addition, the resistor ladder circuit shown in FIG. 7 is commonly used in sub-A/D converter circuits 2, 3, 4 and 53 in the respective stages. In FIG. 6, after each of the comparators 21, 22 and 23 has compared the electric potential at the sub-A/D converter circuit signal input terminal 33 with the electric potentials at the sub-A/D converter circuit reference voltage input terminals 34, 35 and 36 corresponding to the respective comparators, the resulting output signals are inputted to an encoder 24. The output signals from the encoder 24 are, after having been inputted to latches 25 and 26, outputted through sub-A/D converter circuit output terminals 37 and 38. After those output signals have been inputted to a sub-D/A converter circuit 5 shown in FIG. 5 which converts in turn those signals into an analog voltage equivalent to the digital data of 2 bits, an output signal from the sample and hold circuit 1 is subtracted from the analog voltage signal in an addition circuit 11. The output signal from the addition circuit 11 is amplified in an amplification circuit 8 to be inputted through an MDAC output terminal 18 to both of a sub-A/D converter 3 in the second stage and an MDAC 15 in the second stage. The waveform of the signal vout1 at the MDAC output terminal 18 is shown in FIG. 8(b).

The signal which has been inputted through the MDAC output terminal 18 to both of the sub-A/D converter circuit 3 in the second stage and the MDAC 15 in the second stage is processed in the same manner as that in the first stage to be inputted to both of a sub-A/D converter circuit 4 in the third stage and an MDAC 16 in the third stage. The waveform of the signal vout2 at an MDAC output terminal 19 is shown in FIG. 8(c).

The signal which has been inputted through the MDAC output terminal 19 to both of the A/D converter circuit 4 in the third stage and the MDAC 16 in the third stage is processed in the same manner as that in the first stage to be inputted to a sub-A/D converter circuit 53 in the fourth stage. The waveform of the signal vout3 at an MDAC output terminal 20 is shown in FIG. 8(d).

The output signals of the sub-A/D converter circuits 2, 3, 4 and 53 in the respective stages are fetched as the output of the A/D converter circuit through a digital correction circuit 52.

SUMMARY OF THE INVENTION

However, since in the conventional pipeline type A/D converter circuit, as shown in FIG. 8, each of the MDAC output signals is largely increased simultaneously at a certain timing, there arises a disadvantage that the errors are added to one another in the respective stages so that the resulting large error is obtained.

When the DC gain of the operational amplifier which is employed in the MDAC is small, the error in the output of the MDAC becomes largest when the output voltage of the MDAC is greatly changed. For example, in FIG. 8(b), it is assumed that the differential non-linear error (hereinafter, referred to as "a DNL error" for short, when applicable) of 0.8 LSB occurs at the timing the output voltage vout1 is greatly changed (indicated by a dotted line) due to the small DC gain of the operational amplifier employed in the MDAC. Then, as shown in FIG. 8(c), the output voltage vout2 also is changed greatly at the same timing. Assuming that the magnitude of the voltage of the error which occurs due to the large output change in the output voltage vout2 is equal to that in the case of the output voltage vout1 and that the amplification degree of the amplification circuit 8 is 2, then the DNL error which occurs in only the MDAC 15 in the second stage becomes half the DNL error which occurs in only the MDAC 14 in the first stage, i.e., 0.4 LSB. As a result, the DNL error in the output voltage vout2 becomes the sum, 1.2 LSB, of the DNL error, 0.8 LSB, which occurs in only the MDAC 14 in the first stage and the DNL error, 0.4 LSB, which occurs in only the MDAC 15 in the second stage.

Likewise, assuming that the magnitude of the voltage of the error which occurs due to the large output change in the output voltage vout3 is equal to that in the case of the output voltage vout1 and also the amplification degree of the amplification circuit 9 is 2, then the DNL error which occurs in only the MDAC 16 in the third stage becomes a quarter the DNL error which occurs in only the MDAC 14 in the first stage, i.e., 0.2 LSB. As a result, the DNL error in the output voltage vout3 becomes the sum, 1.4 LSB, of the DNL error, 0.8 LSB, which occurs in the MDAC 14 in the first stage, the DNL error, 0.4 LSB, which occurs in only the MDAC 15 in the second stage and the DNL error, 0.2 LSB, which occurs in only the MDAC 16 in the third stage.

As described above, there arises a problem that if the output signals of each of the MDACs are changed simultaneously at a certain timing, then the errors in the respective stages are added to one another to provide the resulting large error.

In order to solve the above-mentioned problems associated with the prior art, according to the present invention, an A/D converter circuit is configured in such a way that the offset is obtained through a resistor ladder from which the reference voltages for comparators employed in sub-A/D converter are produced so that the difference occurs in the input/output characteristics between the sub-A/D converter in the first stage and each of the sub-A/D converters in and after the second stage. Since in the A/D converter circuit configured as described above, the shifting occurs among the timings at which the MDAC outputs in the respective stages are greatly changed, the errors in the respective stages are not added to one another at all. Therefore, the total errors in the overall circuit become approximately equal to the error of the MDAC in the first stage and hence the error can be reduced as compared with that in the prior art.

An A/D converter circuit according to the present invention is configured in such a way that in order that the offset may occur in the input/output characteristics between a sub-A/D converter in the first stage and each of sub-A/D converters in and after the second stage, auxiliary resistors are employed in addition to main resistors in the resistor ladder to provide the input/output characteristics of the sub-A/D converter circuit with the offset.

In addition, the two or more kinds of auxiliary resistors are employed for one main resistor, whereby not only the offset can occur in the input/output characteristics between the sub-A/D converter in the first stage and the sub-A/D converter in the second stage, but also more effectively, the offset can occur in the input/output characteristics between the sub-A/D converter in the second stage and the sub-A/D converter in the third stage or the input/output characteristics between the sub-A/D converter in the second stage and the sub-A/D converter in and after the third stage.

Since in the sub-A/D converter circuit in which the resistor ladder configured as described above is employed, the offset occurs in the input/output characteristics, the large DNL errors which occur in the MDACs in the respective stages are not added to one another at all, and hence the DNL error can be reduced as compared with the normal pipeline type A/D converter circuit.

DESCRIPTION OF THE PREFERRED EMBODIMENTS

Figure 1:
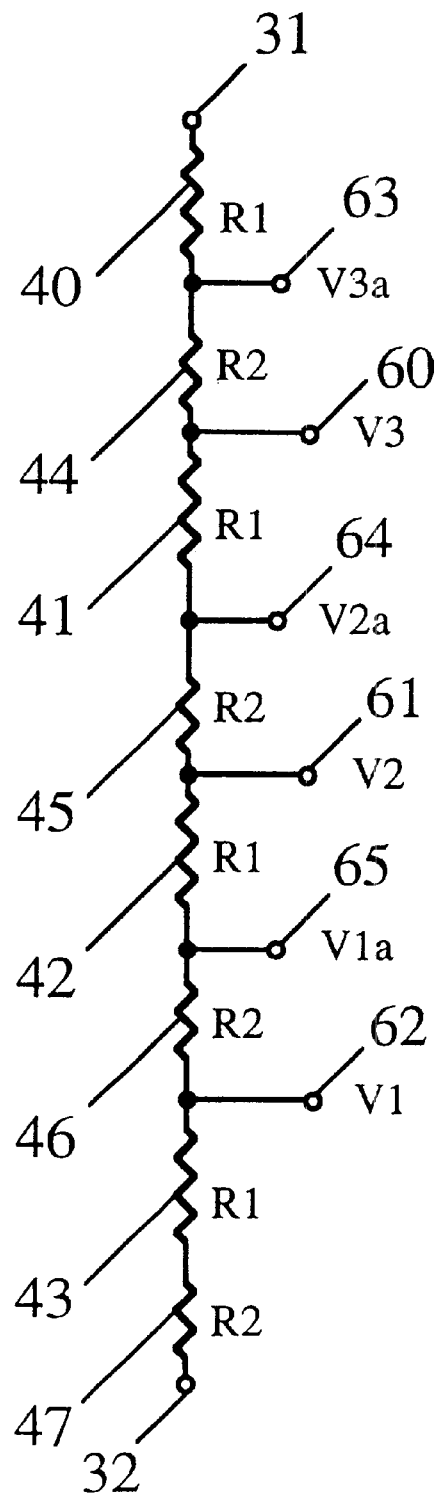
FIG. 1 is a circuit diagram showing a configuration of a resistor ladder circuit according to the present invention.
Figure 3:
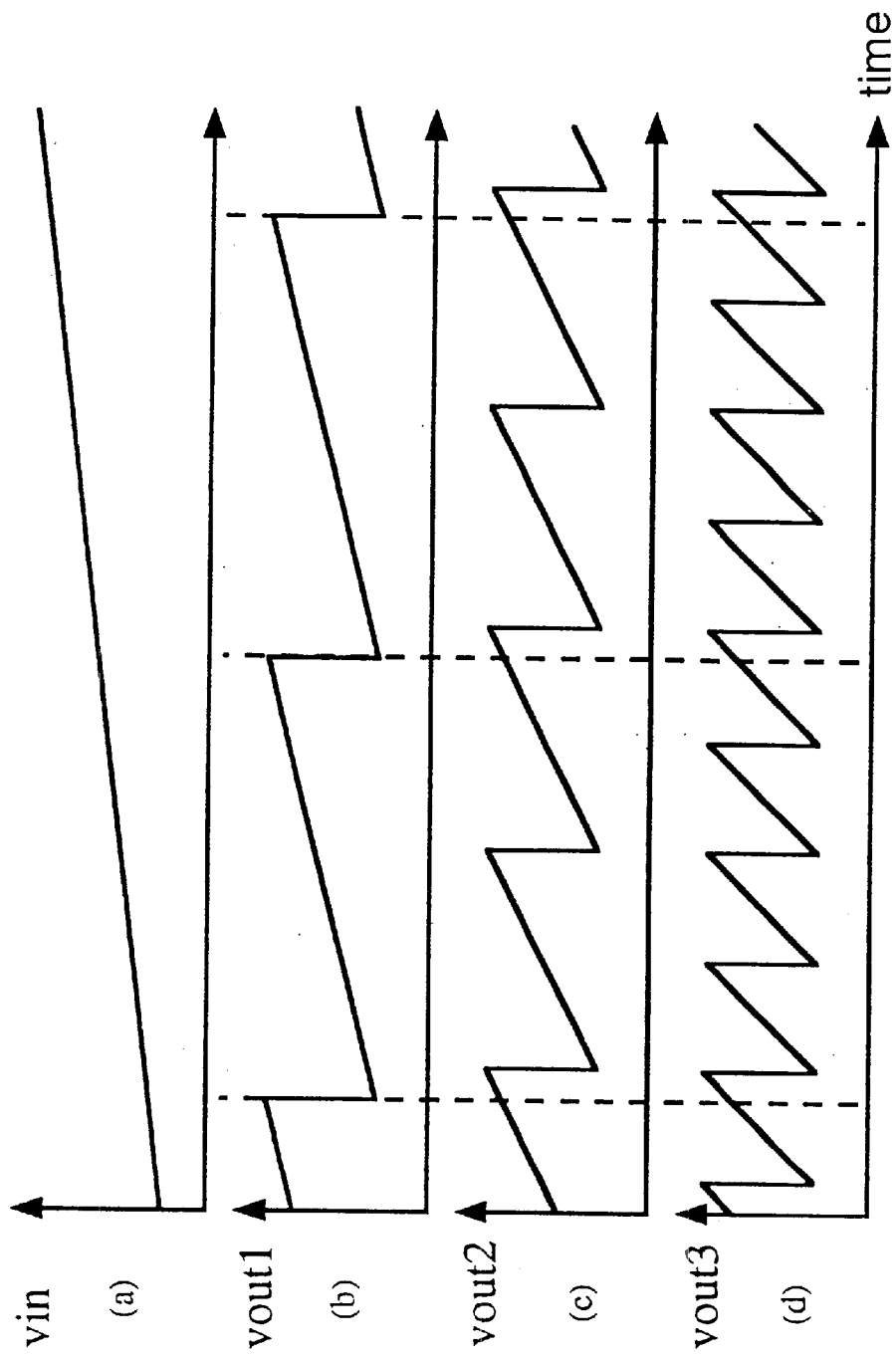
FIG. 3 is a timing chart showing output voltages of MDACs in respective stages and an input voltage to an A/D converter circuit in a pipeline type A/D converter circuit employing the resistor ladder circuit of the present invention.
Figure 9:
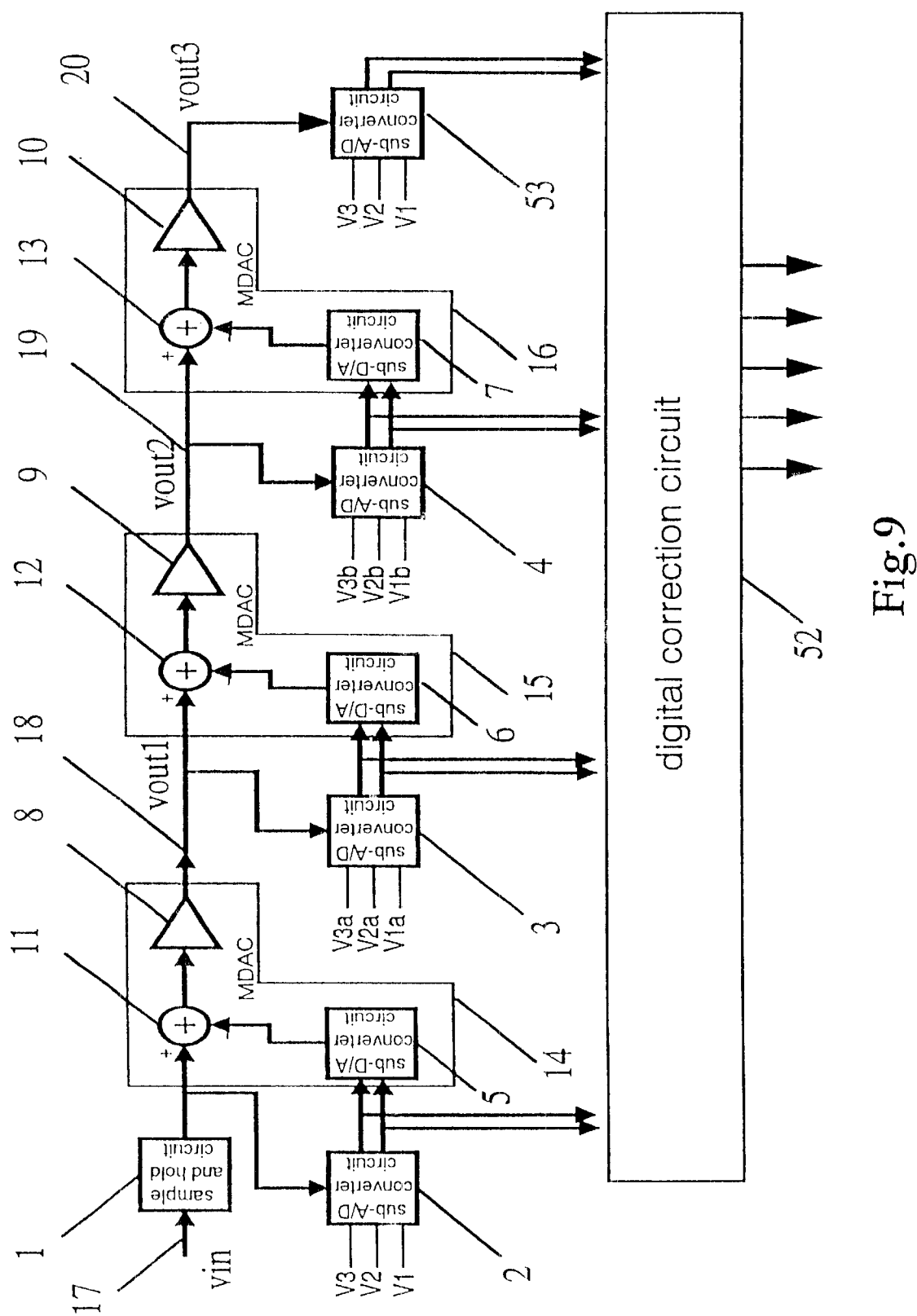
FIG. 9 is a block diagram, partly in a circuit diagram, showing a configuration of a pipeline type A/D converter circuit of the present invention.

The preferred embodiments of the present invention will hereinafter be described in detail with reference to the accompanying drawings. FIG. 9 is a block diagram, partly in a circuit diagram, showing an example of a configuration of a pipeline type A/D converter circuit according to the present invention. In addition, FIG. 1 is a circuit diagram showing an example of a configuration of a resistor ladder circuit from which the reference voltages for comparators of a sub-A/D converter circuit according to the present invention are produced. This resistor ladder circuit is commonly used in each of the sub-A/D converter circuits in the respective stages. But, the reference voltages which are used in the sub-A/D converter circuits in the respective stages are differently used as described later. The resistor ladder circuit is configured in such a way that main resistors 40, 41, 42 and 43 and auxiliary resistors 44, 45, 46 and 47 are alternately connected. Reference voltages 60, 61 and 62 are used as the reference voltages for the comparators of the sub-A/D converter circuit in the first stage. On the other hand, reference voltages 63, 64 and 65 are used as the reference voltages for the comparators of the sub-A/D converter circuits in and after the second stage. By adopting this configuration, the output voltages of the MDACs in the respective stages are as shown in FIG. 3, and hence the timing at which the output voltage of the MDAC in the first stage is greatly changed can be shifted from the timings at which the output voltages of the MDACs in and after the second stage are greatly changed. In this connection, the error which occurs due to the fact that the timings at which the output voltages of the MDACs in and after the second stage are greatly changed are shifted, is corrected by a digital correction circuit 52.

Figure 2:
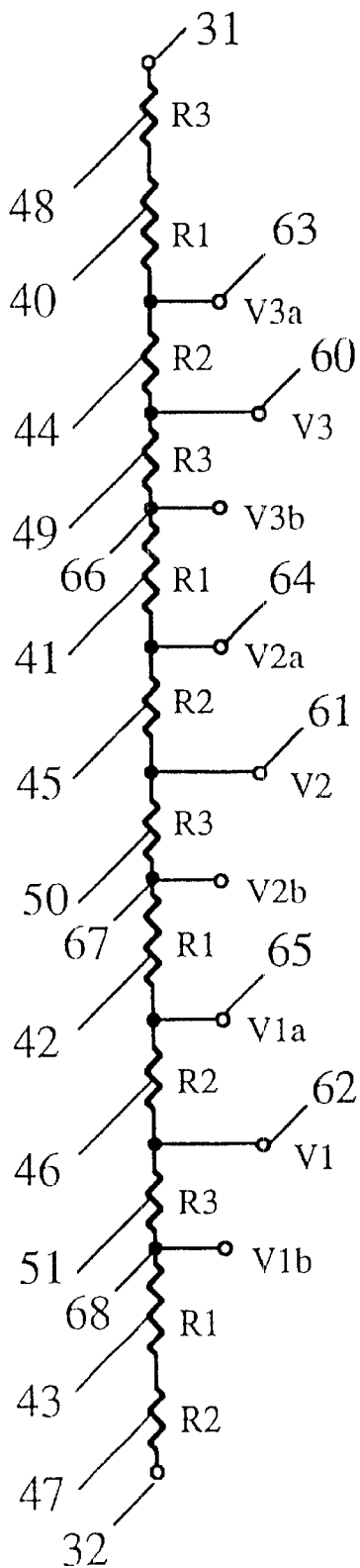
FIG. 2 is a circuit diagram showing a configuration of another resistor ladder circuit according to the present invention.
Figure 4:
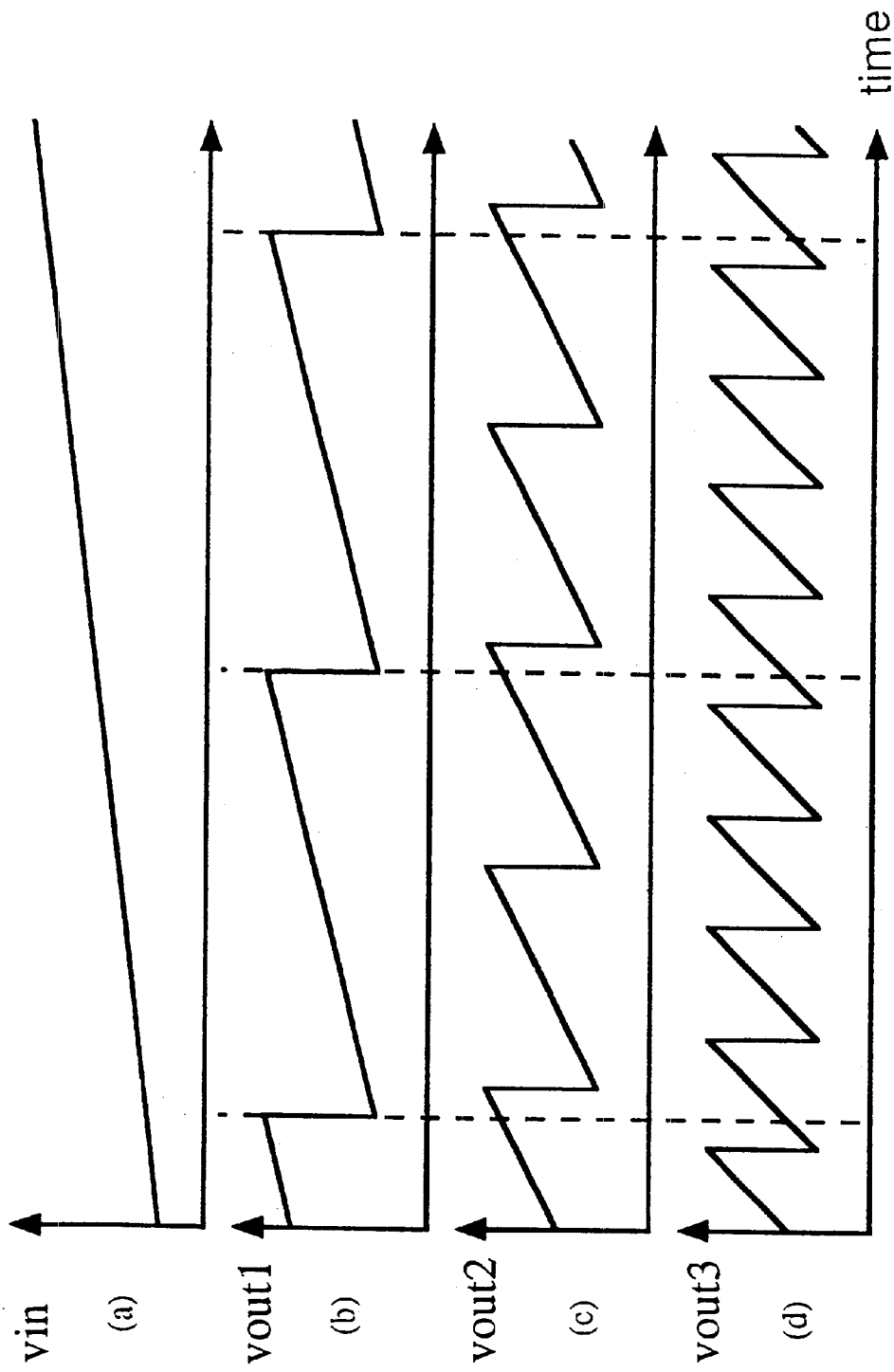
FIG. 4 is a timing chart showing output voltages of MDACS in the respective stages and an input voltage to an A/D converter circuit in a pipeline type A/D converter circuit employing another resistor ladder circuit of the present invention.
Figure 5:
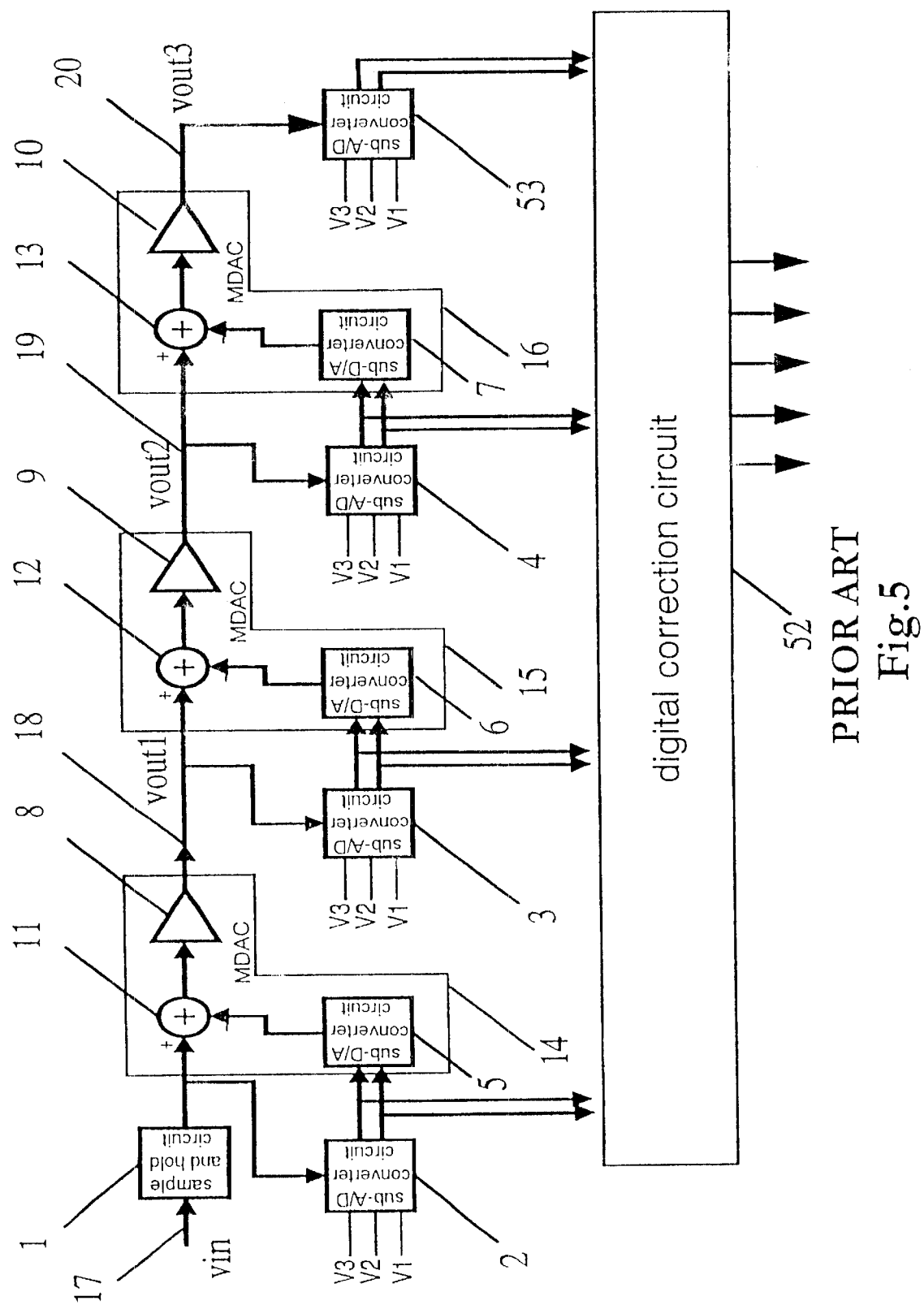
FIG. 5 is a block diagram, partly in a circuit diagram, showing a configuration of a conventional pipeline type A/D converter circuit.
Figure 6:
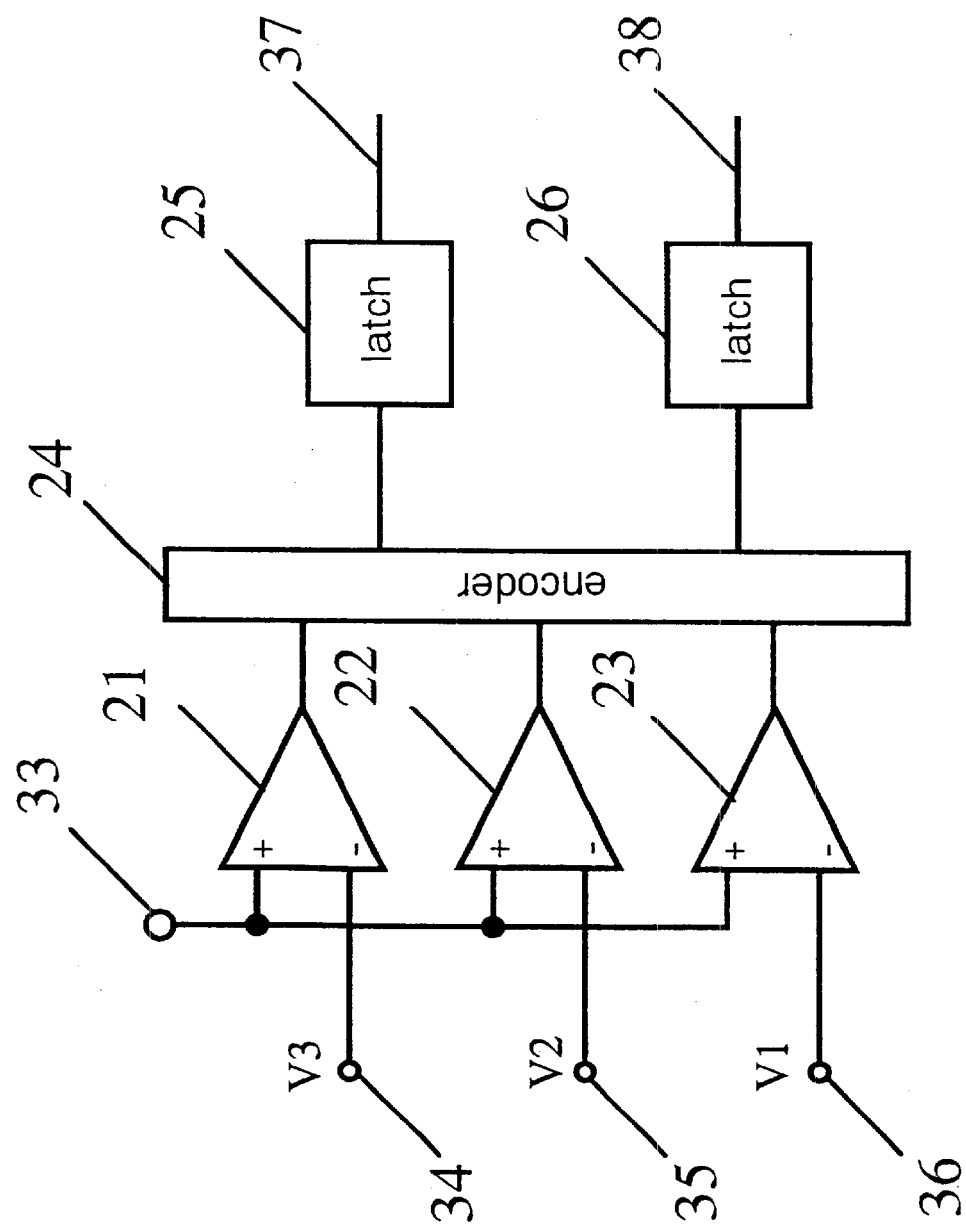
FIG. 6 is a block diagram, partly in a circuit diagram, showing a configuration of a sub-A/D converter circuit employed in a pipeline type A/D converter circuit.
Figure 7:
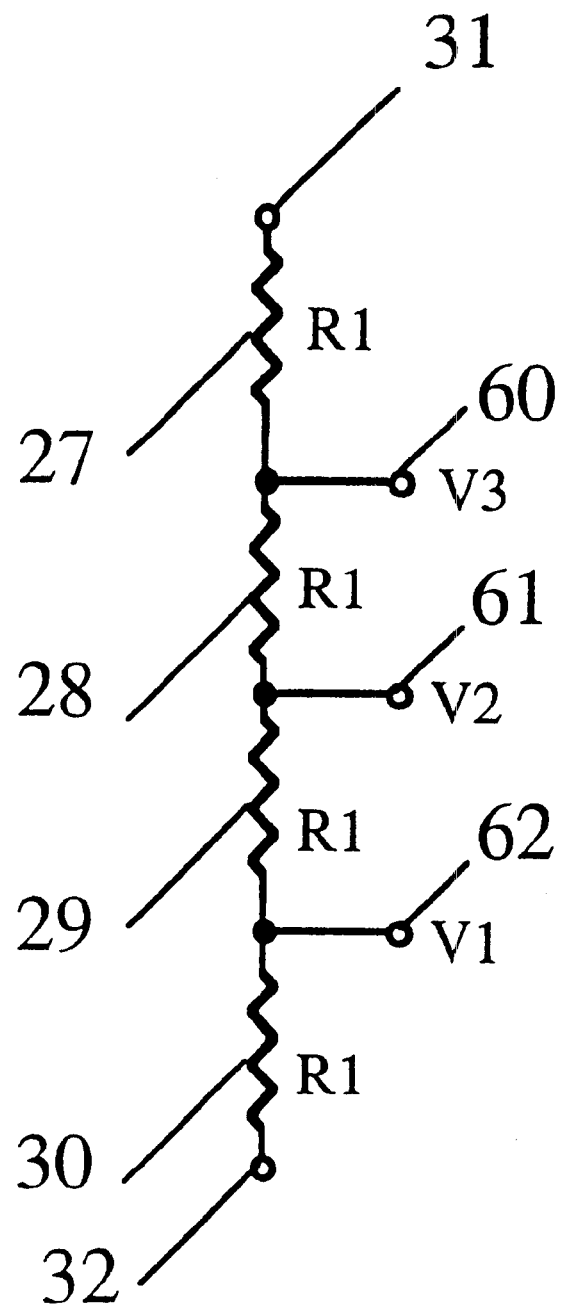
FIG. 7 is a circuit diagram showing a configuration of a conventional resistor ladder circuit.
Figure 8:
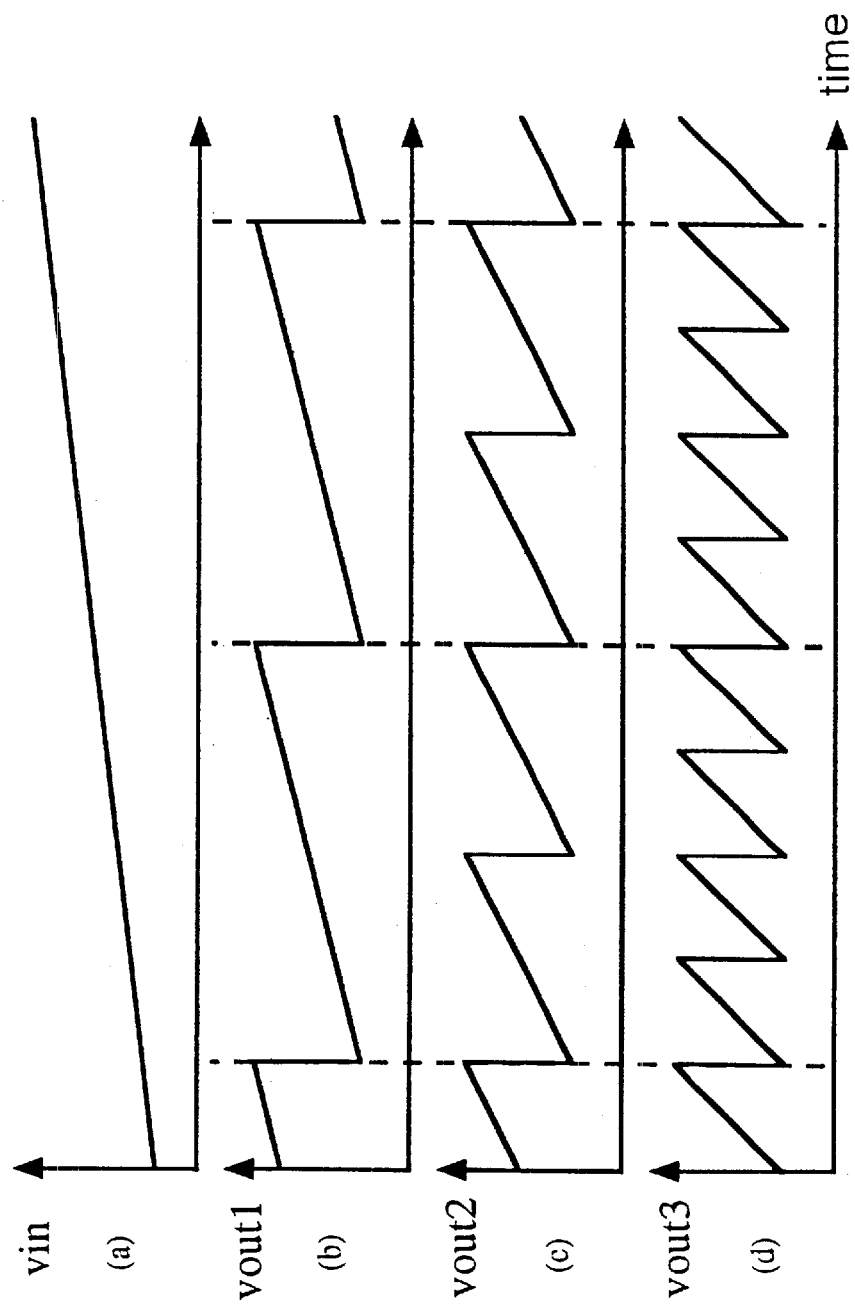
FIG. 8 is a timing chart showing output voltages of MDACs in the respective stages and an input voltage to an A/D converter circuit in a pipeline type A/D converter circuit employing a conventional resistor ladder circuit.

In addition, FIG. 2 is a circuit diagram showing an example of a configuration of another resistor ladder circuit which is used in production of the reference voltages of comparators for sub-A/D converter circuits according to the present invention. This resistor ladder circuit is commonly used in each of the sub-A/D converter circuits 2, 3, 4 and 53 in the respective stages. But, the reference voltages which are used in the sub-A/D converters in the respective stages are differently used as described later. The resistor ladder circuit is configured in such a way that in addition to the circuit shown in FIG. 1, auxiliary resistors 48, 49, 50 and 51 are additionally connected. The reference voltages 60, 61 and 62 are used as the reference voltages for the comparators of the sub-A/D converter circuit in the first stage. On the other hand, the reference voltages 63, 64 and 65 are used as the reference voltages for the comparators of the sub-A/D converter circuit in the second stage. In addition, the reference voltages 66, 67 and 68 are used as the reference voltages for the comparators of the sub-A/D converter circuit in the third stage. By adopting this configuration, the output voltages of the MDACs in the respective stages are as shown in FIG. 4. Thus, since the timings at which the output voltages of the MDACS in the first, second and third stages are greatly changed can be all shifted from one another, the DNL error can be further reduced as compared with that in the circuit shown in FIG. 1. In this case as well, the error which occurs due to the fact that the timings at which the output voltages of the MDACs in and after the second stage are greatly changed are shifted from one another, is corrected by the digital correction circuit 52.

While in the present embodiment, the specific case where the three MDACs are cascade-connected is taken as an example, it should be noted that the present invention can be applied irrespective of the number of MDACs in the case where two or more MDACs are employed. That is, a resistor ladder circuit may be configured in such a way that a plurality of auxiliary resistors are determined in correspondence with the number of MDACs, those auxiliary resistors and the main resistors are connected alternately and in series with one another, and a plurality of resistor circuits each being connected in such a way are connected in correspondence with the number of MDACS.

Since in the circuit system according to the present invention, the shifting occurs among the timings at which the MDAC outputs in the respective stages are greatly changed, the errors in the respective stages are not added to one another. Therefore, it is possible to reduce the DNL error in an A/D converter circuit.

What is claimed is:

1. In an A/D converter circuit: a resistor ladder circuit comprising two terminals through which reference voltages are respectively supplied; a plurality of first resistors each having a first resistance value; and a plurality of second resistors each having a second resistance value different from the first resistance value, the first and second resistors being alternately connected in series between the two reference voltage terminals.

2. An A/D converter circuit according to claim 1; wherein the second resistors comprise two or more resistors disposed between each first resistor.

3. A pipeline type A/D converter circuit comprising: a plurality of stages of sub-A/D converter blocks; and a resistor ladder circuit for providing reference voltages to each sub-A/D converter block; wherein each of the sub-A/D converter blocks comprises a sub-A/D converter and a multiplying D/A converter connected to one another; and each of the resistor ladder circuits comprises two reference voltage terminals and a plurality of first resistors each having a first resistance value and a plurality of second resistors each having a second resistance value different from the first resistance value, the first and second resistors being alternately connected in series with one another between the two reference voltage terminals in order to supply a respective sub-A/D converter block with the reference voltages, and the reference voltages are output at connection points between the first and second resistors.

4. A pipeline type A/D converter circuit comprising: a plurality of stages of sub-A/D converter blocks; and a resistor ladder circuit for providing reference voltages to each sub-A/D converter block; wherein each of the sub-A/D converter blocks comprises a sub-A/D converter and a multiplying D/A converter connected to one another; and each of the resistor ladder circuits comprises two reference voltage terminals and a plurality of first resistors each having a first resistance value and a plurality of second resistors each having a second resistance value different from the first resistance value, the first and second resistors being alternately connected in series with one another between the two reference voltage terminals in order to supply a respective sub-A/D converter block with the reference voltages, the second resistors comprising two or more resistors having a different resistance value connected in series between a pair of first resistors, and the reference voltages for the sub-A/D converter blocks are output at connection points between the auxiliary resistors corresponding to each stage of the sub-A/D converter blocks.

5. An A/D converter circuit according to claim 3; wherein respective stages of sub-A/D converter blocks are supplied with different reference voltages so that outputs of the respective stages reach a maximum value at a different time.

6. An A/D converter circuit according to claim 4; wherein respective stages of sub-A/D converter blocks are supplied with different reference voltages so that outputs of the respective stages reach a maximum value at different times.

7. An A/D converter circuit comprising: one or more cascade-connected A/D converter stages; a resistor divider circuit for providing reference voltages to each A/D converter stage and comprising a plurality of first resistors each having a first resistance value and a plurality of second resistors each having a second resistance value different from the first resistance value, the first and second resistors being alternately connected in series with each other, so that the reference voltages are output from nodes between series-connected resistors.

8. An A/D converter circuit according to claim 7; wherein the A/D converter stages each comprise a sub-A/D converter and a multiplying D/A converter connected to one another.

9. An A/D converter circuit according to claim 8; wherein the sub-A/D converter comprises a plurality of comparators each for receiving an analog input voltage to be converted to a digital value and a reference voltage produced by the resistor divider network and producing a comparison output signal based on the difference therebetween, and an encoder circuit for receiving the comparison output signals of the comparators and producing a digital output according to the comparison output signals.

10. An A/D converter circuit according to claim 7; wherein respective A/D converter stages are supplied with different reference voltages so that outputs of the respective stages reach a maximum value at different times.

* * * * *